(12) United States Patent
Tokunaga

(10) Patent No.: US 10,074,785 B2
(45) Date of Patent: Sep. 11, 2018

(54) LIGHT-EMITTING DEVICE

(71) Applicant: NICHIA CORPORATION, Anan-shi, Tokushima (JP)

(72) Inventor: Eiji Tokunaga, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/356,472

(22) Filed: Nov. 18, 2016

(65) Prior Publication Data

US 2018/0145233 A1  May 24, 2018

(51) Int. Cl.
| | | |
|---|---|---|
| H01L 23/544 | (2006.01) | |
| H01L 33/62 | (2010.01) | |
| H01L 33/58 | (2010.01) | |
| H01L 33/50 | (2010.01) | |
| H01L 33/52 | (2010.01) | |

(52) U.S. Cl.
CPC ............ *H01L 33/58* (2013.01); *H01L 23/544* (2013.01); *H01L 33/50* (2013.01); *H01L 33/62* (2013.01)

(58) Field of Classification Search
CPC ..... H01L 23/544; H01L 33/502; H01L 33/54; H01L 2933/0041
USPC .......................................................... 257/98
See application file for complete search history.

(56) References Cited

U.S. PATENT DOCUMENTS

| | | | | |
|---|---|---|---|---|
| 2009/0008654 | A1* | 1/2009 | Nagai ................. | H01L 25/0753 257/88 |
| 2011/0291154 | A1* | 12/2011 | Noichi .................. | H01L 33/486 257/99 |
| 2012/0086024 | A1* | 4/2012 | Andrews ............. | H01L 25/0753 257/88 |
| 2012/0248483 | A1* | 10/2012 | Beppu .................. | H01L 33/505 257/98 |
| 2013/0329425 | A1* | 12/2013 | Lowes ................. | H01L 33/502 362/235 |
| 2015/0179895 | A1* | 6/2015 | Herner ................. | H01L 27/156 257/89 |
| 2016/0155905 | A1 | 6/2016 | Amo et al. | |
| 2016/0190402 | A1* | 6/2016 | Kobayashi ............ | H01L 23/544 257/98 |
| 2016/0293813 | A1* | 10/2016 | Aruga .................... | H01L 33/58 |

FOREIGN PATENT DOCUMENTS

| | | |
|---|---|---|
| JP | 2006-203058 A | 8/2006 |
| JP | 2008-524831 A | 7/2008 |
| JP | 2012-256848 A | 12/2012 |
| JP | 2016-103618 A | 6/2016 |

\* cited by examiner

*Primary Examiner* — Marcos D Pizarro
*Assistant Examiner* — Antonio Crite
(74) *Attorney, Agent, or Firm* — Foley & Lardner LLP

(57) ABSTRACT

A light-emitting device includes a support body having a wiring pattern; a light-emitting element mounted on the wiring pattern and having a planar shape that is approximately a regular hexagon; and a light transmissive member including: an approximately semispherical lens portion covering the light-emitting element, and a flange portion disposed around a periphery of the lens portion.

13 Claims, 3 Drawing Sheets

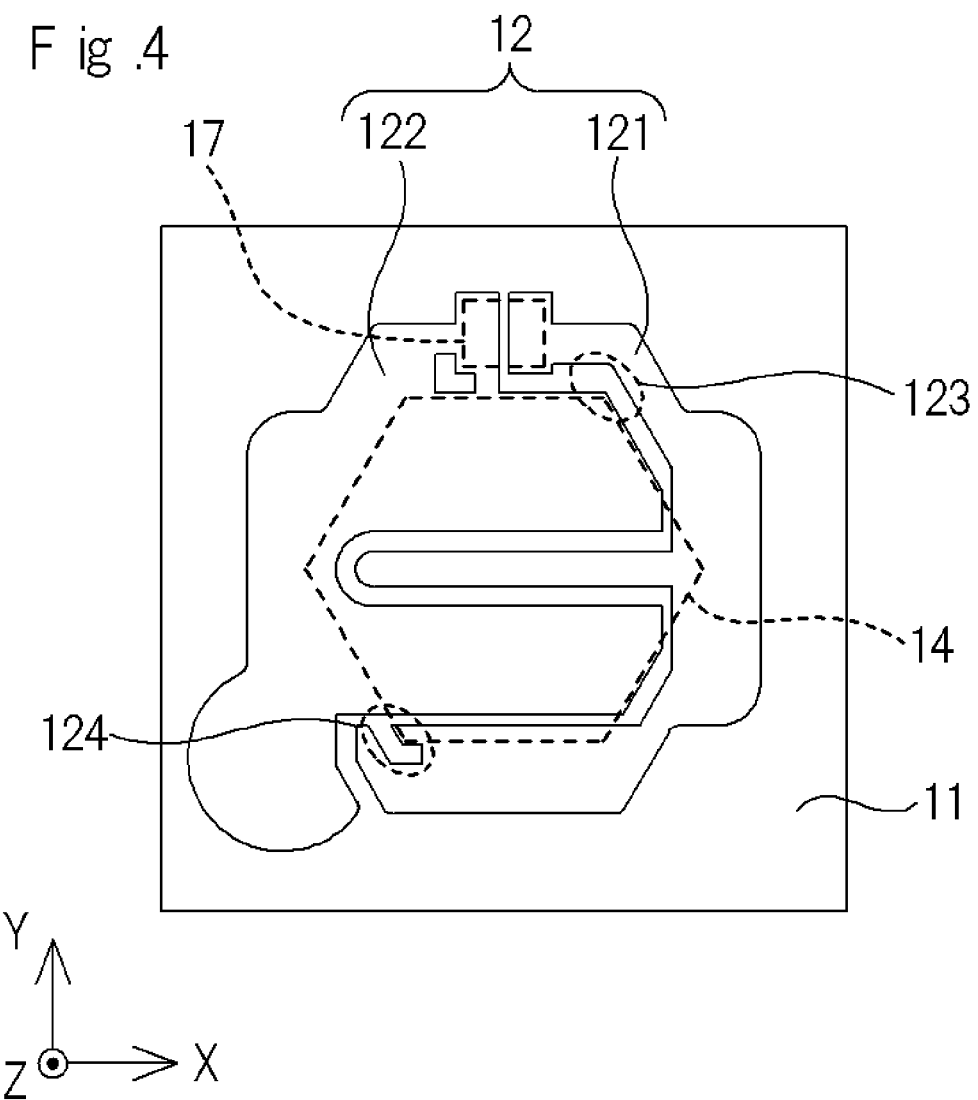

LIGHT-EMITTING DEVICE

BACKGROUND

The present disclosure relates to a light-emitting device.

A light-emitting device is known in which a light transmissive member having a semispherical lens portion covers a light-emitting element that is rectangular in shape in a plan view. See, for example, Japanese Unexamined Patent Application Publication No. 2010-199487.

SUMMARY

In one embodiment, a light-emitting device includes a support body having a wiring pattern; a light-emitting element mounted on the wiring pattern and having a planar shape that is approximately a regular hexagon; and a light transmissive member including: an approximately semispherical lens portion covering the light-emitting element, and a flange portion disposed around a periphery of the lens portion.

According to the device described above, light extraction efficiency can be improved.

BRIEF DESCRIPTION OF THE DRAWINGS

FIG. 4 is a schematic plan view of a support body and a wiring pattern according to a first embodiment.

DETAILED DESCRIPTION OF EMBODIMENTS

Light-Emitting Device 100 According to First Embodiment

Figure 1:
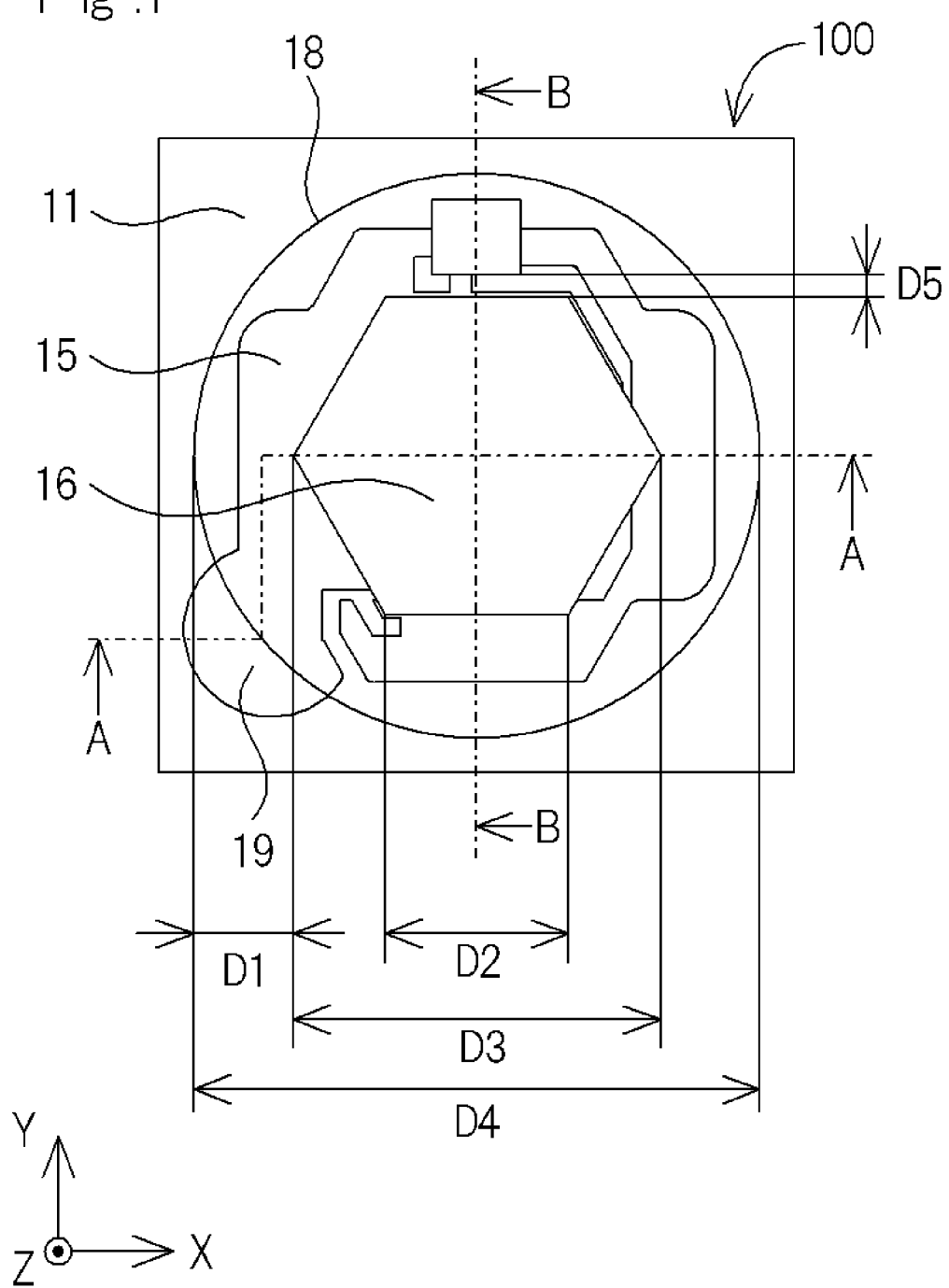
FIG. 1 is a schematic plan view of a light-emitting device according to a first embodiment.
Figure 2:
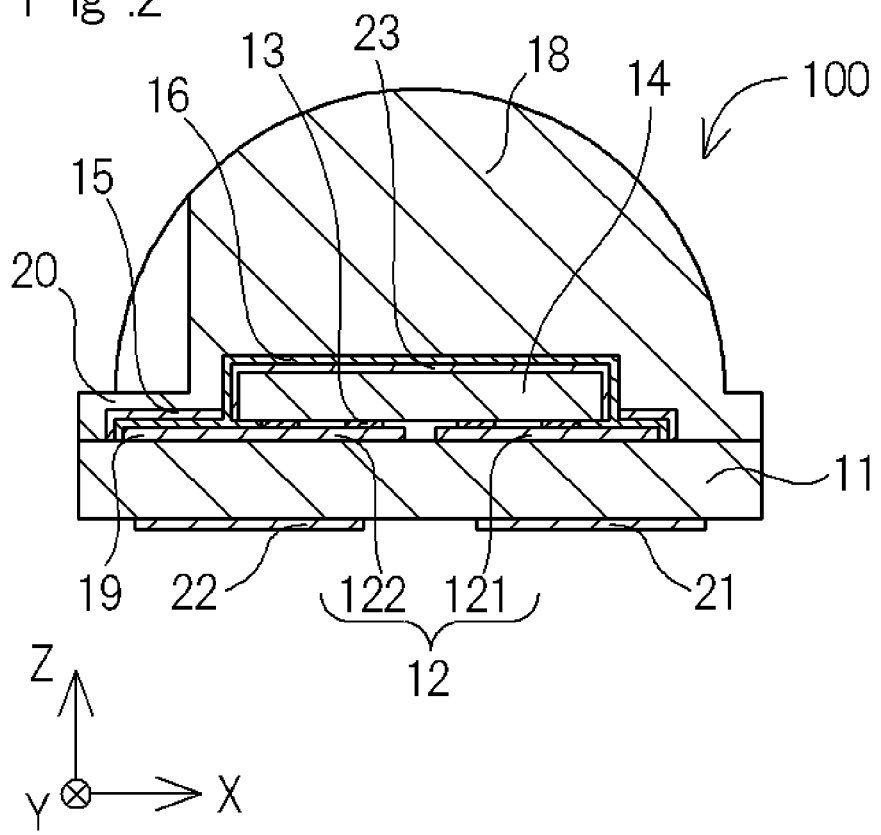
FIG. 2 is a schematic view illustrating a cross section taken along the line A-A of FIG. 1.
Figure 3:
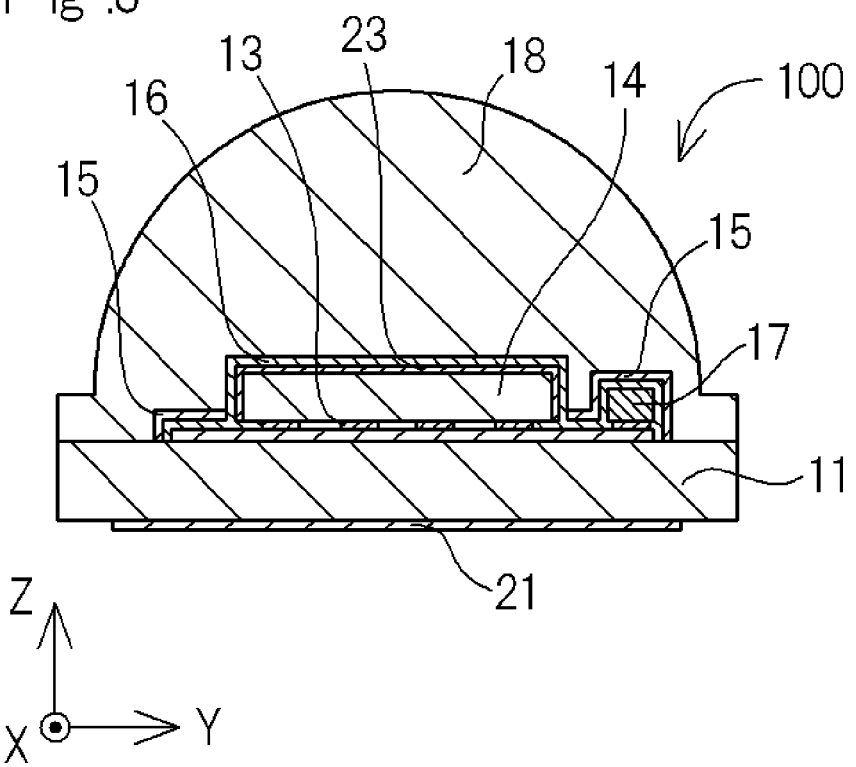
FIG. 3 is a schematic view illustrating a cross section taken along the line B-B of FIG. 1.

FIG. 1 is a schematic plan view of a light-emitting device according to a first embodiment. FIG. 2 is a schematic view illustrating a cross section taken along the line A-A of FIG. 1. FIG. 3 is a schematic view illustrating a cross section taken along the line B-B of FIG. 1. FIG. 4 is a schematic plan view of a support body and a wiring pattern according to a first embodiment.

As shown in FIGS. 1-3, a light-emitting device 100 according to a first embodiment comprises a support body 11, a wiring pattern 12 formed on the support body 11, a light-emitting element 14 mounted on the wiring pattern 12 and having a planar shape that is approximately a regular hexagon, and a light transmissive member including an approximately semispherical lens portion 18 covering the light-emitting element 14 and a flange portion 20 arranged on the periphery of the lens portion 18. Furthermore, the light-emitting device 100 comprises a phosphor layer 16 covering the wiring pattern 12 located on the periphery of the light-emitting element 14 and the light-emitting element 14, an insulation layer 15 covering an upper face of the phosphor layer, and a protective element 17 mounted on the wiring pattern. The protective element 17 is covered by both the phosphor layer 16 and the insulation layer 15. The wiring pattern includes a recognition target portion 19 that is covered by the flange portion.

In the case in which a semispherical lens is placed on the light-emitting element, the light from the center of the light-emitting element is readily output from the lens, whereas the light from the area distant from the center of the light-emitting element is readily reflected because of the semispherical lens shape. If the light-emitting element is a rectangle, the corners are more distant from the center of the light-emitting element (assuming a constant light-emitting element area), which results in loss of light. A hexagonally shaped light-emitting element can reduce the distances from the center of the light-emitting element to the corners (assuming a constant light-emitting element area), thereby increasing the light extraction efficiency.

Hereinafter, the light-emitting device 100 will be described in detail.

Support Body 11

The support body 11 is a member for arranging electronic components such as the light-emitting element 14 and a protective element 17 thereon. The support body 11 can have any appropriate shape, but, is preferably of a shape with a flat upper surface such as a rectangular plate. In terms of the area of the upper surface of the support body for example, it is in a range between about 0.4 $mm^2$ and about 25 $mm^2$.

Wiring Pattern 12

The wiring pattern 12 is a member formed on the support body 11, and electrically connects the light-emitting element 14 arranged on the support body 11 to an external power source. The wiring pattern 12 is used to apply voltage from the external power source to the light-emitting element 14.

The light-emitting element 14 is disposed on the wiring pattern 12. It is preferable that the wiring pattern 12 be disposed in a wide area in the periphery of the light-emitting element 14 in such a manner that heat generated by the light-emitting element 14 is efficiently dissipated via the wiring pattern 12. It is noted that a phosphor layer 16 or the insulation layer 15 may be formed on the surface of the wiring pattern 12 in the periphery of the light-emitting element 14, for example, by an electrodeposition method.

The wiring pattern 12 comprises a conductive material, and preferably comprises materials that are physically and chemically stable, have high conductivity, and have good heat dissipation. The wiring pattern 12 can comprise, for example, metal such as Au (gold), Ag (silver), Cu (copper), aluminum, tungsten, iron, nickel or alloy such as iron-nickel alloy and phosphor bronze. Preferably, the surface of the wiring pattern 12 is covered by materials having high reflectivity (that is, light-reflectivity with respect to the peak wavelength of light emitted from the light-emitting element 14), such as Au (gold) and Ag (silver).

The wiring pattern 12 can have any appropriate thickness, but a larger thickness is preferable than a smaller thickness in order to enhance heat dissipation. Specifically, it is preferable that the thickness of the wiring pattern 12 is in a range of approximately 5 to 80 μm.

As shown in FIG. 4, the wiring pattern 12 preferably includes a groove-shaped alignment mark along the perimeter of the light-emitting element 14 in close proximity to a corner of the light-emitting element in a plan view. The wiring pattern 12 can have the alignment mark in one location, but preferably in multiple locations. In the case of providing two or more alignment marks, it is preferable to provide the first alignment mark 123 in close proximity to a corner of the light-emitting element 14, and the second alignment mark 124 at the corner of the light-emitting element 14 that is most distant from the corner where the first alignment mark 123 is positioned in close proximity. The wiring pattern 12 includes a first wiring pattern 121 and a second wiring pattern 122 on the support body 11. The alignment mark may be formed so as to link with the groove portion between the first wiring pattern 121 and the second wiring pattern 122. An alignment mark is a mark which is arranged at a specific location on the support body 11 for facilitating the alignment between the light-emitting element 14 and the support body 11.

Light-Emitting Element 14

The light-emitting element 14 is disposed on the wiring pattern 12 formed on the support body 11. The light-emitting element 14 is positioned approximately in the center of the support body 11 in a plan view. A portion of a side of the perimeter of the light emitting element is preferably oriented substantially in parallel to a corresponding nearest side of the support body. It is preferable that a light-emitting diode is employed for the light-emitting element 14. The light-emitting diode is, preferably, a stacked structure including a light-emitting layer on a growth substrate. Examples of the material for the stacked structure include various semiconductors, for example, nitride semiconductors such as InN, AlN, GaN, InGaN, AlGaN, and InGaAlN, III-V group compound semiconductors, and II-VI group compound semiconductors. As the growth substrate, insulation substrates such as sapphire or electrically-conductive substrates such as SiC, GaN, and GaAs can be employed. The light-emitting element 14 includes electrodes at positions on an inner side with respect to the periphery of the light-emitting element 14. The shape of the electrodes of the light-emitting element 14 is not particularly limited, and the electrodes can be formed in various shapes such as an approximately rectangle or circle. The materials of the electrodes of the light-emitting element 14 are not particularly limited. The number of light-emitting elements 14 disposed on the wiring pattern 12 is not particularly limited and may be single or plural.

The planar shape of the light-emitting element 10 is approximately a regular hexagon. An approximate regular hexagon herein tolerates fluctuations of the internal angles of the six corners by about 5 degrees plus or minus 120 degrees. Each side of the hexagon is normally a straight line, but may be slightly curved or bent in accordance with the semiconductor layer processing accuracy. Accordingly, taking the above into consideration, the approximately regular hexagon for the planar shape of the light-emitting element 10 includes those closely resembling a regular hexagon.

The length of each side of such a light-emitting element having a planer shape of an approximate regular hexagon, for example, is in a range between about 300 μm and about 2000 μm. In other words, the length of the diagonal connecting two corners that are farthest apart, for example, is in a range between about 600 μm and about 4000 μm. In terms of the area of the light emitting element, for example, it is in a range between about 0.2 mm$^2$ and about 10 mm$^2$.

In the case in which the substrate for growing the light-emitting element is an insulator and the phosphor layer is formed by using an electrodeposition method, a conductive cover layer is required on the surface of the substrate. The conductive cover layer can be removed prior to the insulation layer forming step, or be converted into an insulating layer 23 by oxidation or the like, as shown in FIGS. 2 and 3. In the case of oxidizing the conductive cover layer, it is preferable to use a material which can be modified to be light transmissive. For the cover layer materials, for example, Mg, Al, Si, Zr, Zn, Pb, or the like, can be used. Since it will be removed prior to the insulation layer forming step or will be modified to be an insulation member, the light-emitting device will not include the cover layer, or will include the member that has been modified to an oxide or the like.

In the case in which the substrate for the light-emitting element is a conductive material, the cover layer may be formed by using a light transmissive insulating material after forming a phosphor layer on the light-emitting element in order to prevent the formation of a reflective layer on the light-emitting element. In this case, for the cover layer, for example, an oxide, such as $Al_xO_y$ (1<x, 1<y), $SiO_x$ (1<x), or the like, an organic material, such as polymethylmethacrylate, polyimide, silicone resin, or the like, can be employed.

Bonding Member 13

A bonding member 13 is a member for bonding the light-emitting element 14 to the wiring pattern 12 formed on the support body 11. The bonding member 13 can be arranged in such a manner as to be interposed at least between the electrodes of the light-emitting element 14 and the wiring pattern 12. For the bonding member 13, materials that conduct electricity between the light-emitting element 14 and the wiring pattern 12 are employed. For example, the bonding member 13 can be solder materials such as Sn—Cu, Sn—Ag—Cu, and Au—Sn, metal bumps such as Au, and anisotropic electrically-conductive paste.

Recognition Target Portion 19

The recognition target portion 19 is formed by the wiring pattern 12, which is a conductive material, and is covered by the flange portion in a plan view. Because the recognition target portion 19 is made of a conductive material, it can easily be covered by the insulation member 15 by way of electrodeposition. The recognition target portion 19 is preferably covered completely by the insulation layer 15, but can be partially exposed from the insulation layer 15.

The number of recognition target portions 19 can be appropriately determined, and either a single recognition target portion 19 or a plurality of recognition target portions 19 can be included according to the purpose of the recognition. The recognition target portion may have any appropriate shape such as a circular shape, a triangular shape, a quadrilateral shape, an L-shape, and a T-shape, that allows visual recognition or digital recognition of the recognition target portion 19.

Use of the recognition target portion 19 is not particularly limited, and the recognition target portion 19 can be utilized, for example, when shifts in the position of the light-emitting element 14 or light transmissive member are inspected, when an array of the light-emitting modules is divided into units of modules, or when the polarities of electrode terminals described below are distinguished.

The position of the recognition target portion 19 is not particularly limited, but preferably is on a corner portion, that is, in an area in close proximity of a corner inclusive of the corner of the support body 11. In this way, in the case where the recognition target portion 19 serves as a cathode mark, it can be easy to recognize the polarity of the light-emitting device 100 based on the direction of the support body 11. The cathode mark is a mark for distinguishing an electrode terminal 22 of a negative electrode from an electrode terminal 21 of a positive electrode in a plan view of the light-emitting device 100. It is noted that it only needs to distinguish the electrode terminals, and the cathode mark is not necessarily formed in a region closer to the electrode terminal 22 of a negative electrode. In the case where material having a rectangular shape in the plan view serves as the support body 11, the lens member 18 is often formed in a central portion of the support body 11, which easily secures a space in which the recognition target portion 19 is arranged on the corner portion of the support body 11. The corner portion herein is an area from a corner of the support body 11 up to one fourth of the longest side of the perimeter of the support body. It is preferable to have the recognition target portion only at one corner portion.

The recognition target portion 19 can be arranged appropriately, but a non-point symmetry arrangement around a center of the support body 11 as shown in FIG. 1 is preferable. In this manner, a shape of the light-emitting device 100, when viewed from above, is seen to be different from, for example, a shape of the light-emitting device 100 when viewed from above after rotating at 180 degrees, specifically with respect to a location of the recognition target portion 19. Accordingly, in the case where the recognition target portion 19 serves as the cathode mark, the polarity of the light-emitting device 100 can be recognized based on the direction of the light-emitting device 100 (support body 11). Rotating the light-emitting device 100 (or rotating the support body 11) at 180 degrees means inverting the shape prior to the rotation horizontally and vertically. The recognition target portion 19 is preferably, arranged on one of four corner portions of the support body 11, for example, as illustrated in FIG. 1.

Insulation Layer 15

The insulation layer 15 is made of a material in which a difference in reflectivity between the support body 11 and the insulation layer 15 is larger than a difference in reflectivity between the support body 11 and the recognition target portion 19. Specifically, in the case where the support body 11 comprises at least one of alumina, aluminum nitride, mullite, glass epoxy, and epoxy resin, and the recognition target portion 19 is made of Au (gold) and Cu (copper), which can be the same material as that of the wiring pattern 12, it is preferable that the insulation layer 15 comprises, for example, at least one of titanium dioxide, silicon dioxide, zirconia, potassium titanate, alumina, aluminum nitride, boron nitride, mullite, niobium oxide, zinc oxide, barium sulfate, and various rare earth oxides. For the insulation layer 15, it is preferable to use a material which allows a 30% or more difference in reflectivity between the support body 11 and the insulation layer 15 at the peak wavelength of the light emitted to the support body 11 and the insulation layer 15 during visual recognition or digital recognition. Further, a 40% or more difference in reflectivity is more preferable. In this manner, even in the case where the difference between the reflectivity of the support body 11 and the reflectivity of the insulation layer 15 varies due to a difference in environments during the visual recognition or digital recognition (e.g., in the case where the reflectivity of the support body 11 ranges from 10 to 30%, and the reflectivity of the insulation layer 15 ranges from 40 to 70%), the difference between the reflectivity of the support body 11 and the reflectivity of the insulation layer 15 can be sufficiently secured (that is, at least a 10% difference in reflectivity is secured in the case of the aforementioned example). Accordingly, the position of the recognition target portion 19 can be easily identified in a variety of environments.

The insulation layer 15 reflects a light emitted from the light-emitting element 14. Specifically, the insulation layer 15 reflects 50% or more of the light emitted from the light-emitting element 14 at the peak wavelength without being excited by the light emitted from the light-emitting element 14. This allows to prevent the light from absorbed too much by the insulation layer 15. Although not particularly limited, it is preferable that the reflectivity of the insulation layer 15 (i.e. the reflectivity with respect to the peak wavelength of the light emitted from the light-emitting element 14) is higher than the reflectivity of the recognition target portion 19 (i.e. the reflectivity with respect to the peak wavelength of the light emitted from the light-emitting element 14) in order to improve the output of the light-emitting device 100.

In the case in which the recognition target portion 19 and the wiring pattern 12 on the periphery of the light-emitting element 14 are covered by the phosphor layer 16, it is preferable to cover the phosphor layer 16 with the insulation layer 15 so as to prevent the phosphor layer 16 from causing color variation.

The insulation layer 15 covers at least a periphery of the recognition target portion 19, and preferably covers the entire area of the recognition target portion 19. Because at least a periphery of the recognition target portion 19 is covered with the insulation layer 15, the position of the recognition target portion 19 can be easily identified.

Light Transmissive Member

The light transmissive member includes the lens portion 18 covering the light-emitting element 14, and the flange portion 20 arranged on the periphery of the lens portion 18 and covering at least a part of the recognition target portion 19. The lens portion 18 has a semispherical shape. Covering the light-emitting element 14 by the lens portion 18 allows for protecting the light-emitting element 14 from an external environment. Also, covering the recognition target portion 19 by the flange portion 20 allows for protecting the recognition target portion 19 from the external environment. The lens portion 18 includes a curved surface that condenses the light emitted from the light-emitting element 14.

The light transmissive member is formed with a material that transmits a light emitted from the light-emitting element 14, and specifically formed with a material that transmits 60% or more of the light emitted from the light-emitting element 14, and preferably a material that transmits 70% or more of the light, and more preferably a material that transmits 80% or more of the light, and further preferably a material that transmits 90% or more of the light. Examples of such materials having high light transmissiveness include resin, such as silicone resin, silicone modified resin, epoxy resin, phenol resin, polycarbonate resin, acrylic resin, trimethylpentene resin, polynorbornene resin, or hybrid resin that includes one or more of the aforementioned resins.

The length of the further-extending portion of the wiring pattern 12, which can serve as the recognition target portion 19, from the lens portion 18 to an outermost edge of the further extending portion, is not particularly limited, but is preferably 0.3 mm or more in order to facilitate visual recognition.

In a plan view, the minimum distance D1 from the lens perimeter to the light-emitting element is shorter than the length of a side D2 of the outer shape of the light-emitting element. In a plan view, the minimum distance from the lens perimeter to the light-emitting element is longer than one half the length of a side D2 of the outer shape of the light-emitting element. The minimum distance from the lens perimeter to the light-emitting element, for example, is in a range between 0.3 and 3 mm. In a plan view, the light-emitting element has an area which is 0.3 to 0.4 times the area of the lens portion. In a plan view, a diagonal length D3 connecting the corners of the light-emitting element that are farthest apart is 0.6 to 0.7 times the diameter D4 of the lens portion. In a plan view, the lens portion has an area which is in a range between about 0.4 mm$^2$ and about 25 mm$^2$, for example. The height of the lens is, for example, in a range between about 0.5 to 4 mm.

Phosphor Layer 16

The phosphor layer 16 includes a fluorescent substance that can be excited by the light emitted from the light-emitting element 14 to emit light with wavelength different from that of the light emitted from the light-emitting element 14. The phosphor layer 16 converts the wavelength of the light emitted from the light-emitting element 14 into a different wavelength. The phosphor layer 16 may convert the wavelength of the light emitted from the light-emitting element 14 into a shorter wavelength, but preferably converts the wavelength of the light emitted from the light-emitting element 14 into a longer wavelength in terms of light extraction efficiency of the light emitting device.

The phosphor layer 16 can be disposed in such a manner as to cover at least the upper surface and lateral surfaces of the light-emitting element 14. This allows the refractive index of the phosphor layer 16 to be larger than the refractive index of the light transmissive member disposed in the periphery of the light-emitting element 14, so that the total reflection of the light on the upper surface and the lateral surface of the light-emitting element 14 can be suppressed. Accordingly, this can reduce the light confined in the light-emitting element 14 due to the total reflection, and the absorption of the light in the light-emitting element 14 can be reduced. Furthermore, the phosphor layer 16 may be arranged in such a manner as to cover the recognition target portion 19 or a portion of the wiring pattern 12 located laterally outside a periphery of the light-emitting element 14 in a plan view. It is preferable that the phosphor layer 16 covering the recognition target portion 19 or the wiring pattern 12 located laterally outside the periphery of the light-emitting element 14 is covered by the insulation layer 15 in order to suppress the phosphor layer 16 causing a color unevenness of light emitted from the light emitting device.

Preferably, the phosphor layer 16 is formed with a uniform thickness. This allows to suppress the phosphor layer 16 causing a color unevenness. The term "uniform thickness" includes an approximately uniform thickness. Although the specific thickness of the phosphor layer 16 is not particularly limited, preferably, the thickness is in a range of 0.1 to 100 μm.

As fluorescent substances included in the phosphor layer 16, for example, a combination of one, two or more of any of the substances described below can be used.

The following substances mainly activated by lanthanoids such as Eu and Ce: nitride-based phosphor, oxynitride-based phosphor, and sialon-based phosphor.

The following substances mainly activated by lanthanoids such as Eu and transition metal elements such as Mn: alkali earth halogen apatite phosphor, alkali earth metal boric acid halogen phosphor, alkali earth metal aluminate phosphor, alkali earth silicate phosphor, alkali earth sulfide phosphor, alkali earth thiogallate phosphor, alkali earth silicon nitride phosphor, and germanate phosphor.

The following substances mainly activated by lanthanoids such as Ce: rare-earth aluminate phosphor and rare-earth silicate phosphor.

Organic phosphor or phosphor such as organic complex mainly activated by lanthanoids such as Eu.

Although the shape of the phosphor is not particularly limited, it is preferable that the shape is formed, for example, in a sphere or a form similar to a sphere. Specifically, it is more preferable that the phosphor has a shape having average grain diameter in a range of 0.1 to 100 μm, and more preferably, average grain diameters in a range of 1 to 10 μm.
Protective Element 17

The protective element 17 is disposed on the wiring pattern 12. As the protective element 17, for example, a Zener diode can be used. It is preferable that the protective element 17 is covered by the insulation layer 15 so that an absorption of a light from the light-emitting element 14 can be reduced by the protective element 17.

The side of the protective element opposing the light-emitting element and the side of the light-emitting element opposing the protective element are substantially parallel to one another. Substantially parallel herein includes deviations of ±10° from the parallel lines.

In a plan view, the minimum distance D5 between the light-emitting element and the protective element is shorter than the length of a side D2 of the outer shape of the light-emitting element. In a plan view, the minimum distance between the light-emitting element and the protective element, for example, is in a range between 0.05 and 0.5 mm.
Impregnated Layer In order to prevent the separation of the phosphor layer 16 and/or the insulation layer 15, a light transmissive material may optionally be disposed between the particles in the phosphor layer 16 and/or the insulation layer 15. Moreover, it is preferable to form an impregnated layer for the phosphor layer 16 and/or the insulation layer 15 by impregnating them with a light transmissive material. The impregnated layer may also be formed so as to cover the phosphor layer 16 and/or the insulation layer 15. For the light transmissive material, silicone resins, epoxy resins, or the like, can be used.

The embodiments described above are merely described as examples, and the present invention is not limited to them.

What is claimed is:

1. A light-emitting device comprising:
   a support body;
   a first wiring pattern and a second wiring pattern, both of which are located on the support body, wherein a groove portion is located between the first wiring pattern and the second wiring pattern;
   a light-emitting element mounted on the first and second wiring patterns and having a planar shape that is approximately a regular hexagon; and
   a light transmissive member including:
      an approximately semispherical lens portion covering the light-emitting element, and
      a flange portion disposed around a periphery of the lens portion,
   wherein peripheral edges of the first wiring pattern form a first groove-shaped alignment mark at a first corner of the light-emitting element, the first groove-shaped alignment mark being defined by:
      a first peripheral edge of the first wiring pattern, which extends along a first side of the light-emitting element,
      a second peripheral edge of the first wiring pattern, which opposes the first edge, and is parallel to the first edge,
      a third peripheral edge of the first wiring pattern, which is continuous with the first edge, and extends along a second side of the light-emitting element, and
      a fourth peripheral edge of the first wiring pattern, which is continuous with the second edge, opposes the third edge, and is parallel to the third edge,
      wherein the first groove-shaped alignment mark is continuous with the groove portion located between the first wiring pattern and the second wiring pattern.

2. The light-emitting device according to claim 1, wherein, in a plan view of the light-emitting device, a minimum distance from a perimeter of the lens portion to the light-emitting element is shorter than a length of one side of the planar shape of the light-emitting element and is longer than one half the length of said one side of the planar shape of the light-emitting element.

3. The light-emitting device according to claim 1, further comprising a protective element located on the support body, wherein a minimum distance between the light-emitting element and the protective element is longer than a length of one side of the light-emitting element.

4. The light-emitting device according to claim 1, wherein the support body is approximately rectangular in shape, the second wiring pattern includes a recognition target portion that is covered by the flange portion, and said recognition target portion is positioned only at one corner portion of the support body.

5. The light-emitting device according to claim 1, wherein, in a plan view of the light-emitting device, an area of the light-emitting element is 0.3 to 0.4 times an area of the lens portion.

6. The light-emitting device according to claim 1, wherein, in a plan view of the light-emitting device, a length of a diagonal line connecting corners of the light-emitting element that are farthest apart is 0.6 to 0.7 times a diameter of the lens portion.

7. The light-emitting device according to claim 1, wherein a planar shape of the first and second wiring patterns is different from the planar shape of the light-emitting device.

8. The light-emitting device according to claim 1, further comprising a protective element that is located on the support body and embedded in the light transmissive member.

9. The light-emitting device according to claim 1, wherein exactly one portion of the second wiring pattern is located outside an area of the lens portion of the light transmissive member.

10. The light-emitting device according to claim 1 further comprising a phosphor layer that covers the light-emitting element and portions of the first and second wiring patterns.

11. The light-emitting device according to claim 10, further comprising an insulation layer that covers an upper face of the phosphor layer.

12. The light-emitting device according to claim 1, wherein the first and second wiring patterns define a second groove-shaped alignment mark located at a second corner of the light-emitting element that is farthest from the first corner.

13. The light-emitting device according to claim 12, wherein the second groove-shaped alignment mark is a part of the groove portion located between the first wiring pattern and the second wiring pattern, and is defined by:

a fifth peripheral edge of the first wiring pattern, which extends along a third side of the light-emitting element, a first peripheral edge of the second wiring pattern, which opposes the fifth edge of the first wiring pattern, and is parallel to the fifth edge of the first wiring pattern, a sixth peripheral edge of the first wiring pattern, which is continuous with the fifth edge of the first wiring pattern, and extends along a fourth side of the light-emitting element, and a second peripheral edge of the second wiring pattern, which is continuous with the first edge of the second wiring pattern, opposes the sixth edge of the first wiring pattern, and is parallel to the sixth edge of the first wiring pattern.

\* \* \* \* \*